United States Patent [19]

Swartz

[11] Patent Number: 4,680,810
[45] Date of Patent: Jul. 14, 1987

[54] MEANS FOR CONTROLLING A SEMICONDUCTOR DEVICE AND COMMUNICATION SYSTEM COMPRISING THE MEANS

[75] Inventor: Robert G. Swartz, Highlands, N.J.

[73] Assignee: American Telephone and Telegraph Company, AT&T Bell Labs, Murray Hill, N.J.

[21] Appl. No.: 749,746

[22] Filed: Jun. 28, 1985

[51] Int. Cl.$^4$ ............................................. H04B 9/00
[52] U.S. Cl. ............................. 455/609; 324/158 D; 455/618
[58] Field of Search .............. 455/609, 610, 613, 618; 372/38, 29, 31, 32; 250/205; 324/158 T, 158 D; 364/828, 487

[56] References Cited

U.S. PATENT DOCUMENTS

| | | | |
|---|---|---|---|
| 4,062,632 | 12/1977 | Dixon | 356/72 |
| 4,081,670 | 3/1978 | Albanese | |
| 4,101,847 | 7/1978 | Albanese | 331/94.5 |
| 4,106,096 | 8/1978 | Paoli | 364/481 |
| 4,612,671 | 9/1986 | Giles | 455/609 |

OTHER PUBLICATIONS

*Semiconductor Devices for Optical Communication*, edited by H. Kressel, Springer-Verlag, 1982, "Lightwave Transmitters" by P. W. Shumate and M. DiDomenico, pp. 182-186.
*Applied Physics*, vol. 14, Nov. 1977, "Modulation Behavior of Semiconductor Injection Lasers" by G. Arnold and P. Russer, pp. 255-268.
*Electronics Letters*, vol. 20, No. 11, May 1984, "Transient Chirping in Single-Frequency Lasers: Lightwave Systems Consequences" by R. A. Linke, pp. 472-474.
*The Bell System Technical Journal*, vol. 62, No. 7, Part I, Sep. 1983, "Stabilized Biasing of Semiconductor Lasers" by R. G. Swartz and B. A. Wooley, pp. 1923-1936.
*The Bell System Technical Journal*, vol. 55, No. 7, Sep. 1976, "Derivative Measurements of Light-Current-Voltage Characteristics of (Al, Ga) As Double-Heterostructure Lasers" by R. W. Dixon, pp. 973-980.
*Proceedings of the 13th Circuits and Systems International Symposium*, Houston, Texas, 1980, "Laser Level Control for High Bit Rate Optical Fibre Systems" by D. W. Smith and T. G. Hodgkinson, pp. 926-930.
*The Bell System Technical Journal*, vol. 57, No. 5, May--Jun. 1978, "An Automatic Bias Control (ABC) Circuit for Injection Lasers" by A. Albanese, pp. 1533-1544.

*Primary Examiner*—Joseph A. Orsino, Jr.
*Assistant Examiner*—Leslie Van Beek
*Attorney, Agent, or Firm*—Eugene E. Pacher

[57] ABSTRACT

The novel technique for stabilizing an electronic device, e.g., a semiconductor laser, is disclosed. The technique can advantageously be used to stabilize the bias current of such a laser at or near the lasing threshold of the device. A preferred application of thus stabilized lasers is in optical communication systems. The inventive technique comprises determination of a derivative of a variable characteristic of the device operation, e.g., the voltage across a laser, with respect to a parameter, e.g., the laser bias current. The derivative is determined by a novel method. For the particular case of laser bias stabilization, the method comprises injecting one or more nonsinusoidal ac current components into the laser, and phase-sensitivity detecting the voltage changes at the ac frequencies. The method can, in principle, be used to determine derivatives of arbitrarily high order. A circuit capable of determining the second, third and fourth derivatives of the voltage as a function of bias current is disclosed. The derivative extraction method can also be embodied in measurement apparatus, and as useful in other process control applications.

30 Claims, 14 Drawing Figures

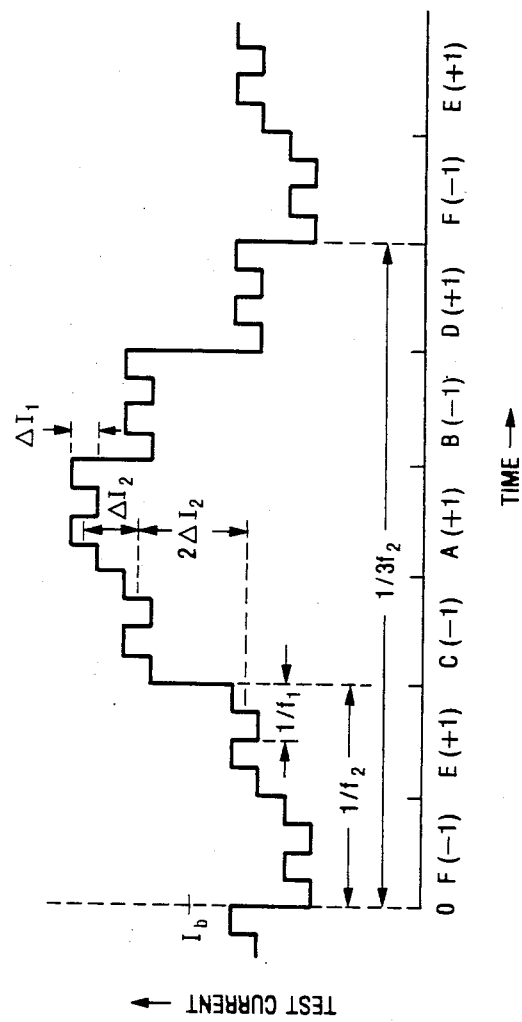

MEANS FOR CONTROLLING A SEMICONDUCTOR DEVICE AND COMMUNICATION SYSTEM COMPRISING THE MEANS

FIELD OF THE INVENTION

This invention pertains to the field of communication systems comprising a fiberguide transmission medium and semiconductor laser radiation sources. In particular, it pertains to such systems comprising laser control means, and to laser control means.

BACKGROUND OF THE INVENTION

Semiconductor laser diodes are frequently used as radiation sources in optical fiber communications, as well as in other fields of technology. In many cases, the laser is operated in a pulse mode, e.g., having a two-level output, with the levels corresponding to logical one and logical zero, respectively. For instance, digital laser transmitters for optical communications frequently are driven by a high frequency modulation current superimposed on a dc bias current. The magnitude of the dc bias current is typically chosen so as to bias the laser near threshold. This practice results in a laser output such that the logic zero corresponds to no, or essentially no, radiation emitted from the laser, and the logic one level to a finite radiation intensity emitted from the laser. The dc bias current serves several purposes, but foremost among these are the functions of minimizing turn-on delay and minimizing the amount of current that must be switched at the data rate.

Because of possible drift in laser threshold due to aging and temperature variations, it is typically necessary to stabilize the bias current using feedback. The prior art knows several methods for achieving stabilization. In systems applications, it has been the practice to use optical feedback, with an external photodetector either at the backside of the laser or at the front, using an optical fiber tap. See, for instance, pp. 182–186 of the article by P. W. Shumate and M. DiDomenico, "Lightwave Transmitters", of *Semiconductor Devices for Optical Communications*, H. Kressel, editor, second edition, Springer-Verlag, 1982. It is to be noted that such prior art stabilization schemes hold the light output of the laser constant, but do not necessarily stabilize the bias current at the desired level. This is a significant shortcoming, since several transmitter parameters, in addition to the extinction ratio, depend strongly on whether the laser is biased above, at, or below threshold. For example, when the laser is biased below threshold, extra turn-on delay typically occurs, leading to data pattern-dependent modulation errors in high speed systems. Also, in single-frequency laser transmitters, frequency shifting may occur as the modulation current drives the laser through threshold. And furthermore, in single loop stabilization systems, the efficacy of feedback in controlling laser variations is typically reduced when bias is sub-threshold. For a discussion of these points, see, for instance, G. Arnold and P. Russer, *Applied Physics*, Volume 14, November 1977, pp. 255–268; R. A. Linke, *Electronics Letters*, Volume 20, No. 11, May 1984, pp. 472–474; and R. G. Swartz and B. A. Wooley, *Bell System Technical Journal*, Volume 62, No. 7, Part 1, September 1983, pp. 1923–1936. On the other hand, when the laser is biased above threshold, reduced extinction ratio results. Also, when the laser is heated, or it ages, the threshold tends to increase so that a bias level initially above threshold can drop below it.

Based on these and other considerations, it would be advantageous to have available a method for stabilizing of the bias point at or near threshold.

As is well known, the dynamical resistance of a laser, i.e., the first derivative of its V/I characteristic, typically has a "kink" at threshold. This is illustrated in FIG. 1, which shows the quantity dV/dI as a function of the forward current through a semiconductor laser. Section 10 of the curve is the dynamical resistance below lasing threshold, and Section 11 above lasing threshold, with 12 referring to the "kink" in the dynamical resistance which coincides with the lasing threshold. See, for instance, R. W. Dixon, *Bell System Technical Journal*, Volume 55, No. 7, September 1976, pp. 973–980.

First and second derivative measurements of semiconductor laser I/V characteristics have been reported. These measurements were typically accomplished by injecting a sinusoidal low-frequency test current $\Delta I \cdot \cos(\omega t)$ into the laser. The first derivative dV/dI was measured by synchronously detecting the component of the voltage response at frequency $\omega$. The second derivative $d^2V/dI^2$ was measured similarly by detecting the component of the voltage response at $2\omega$. Higher order derivatives can, in principle, be measured by detecting additional harmonics of the test response. Unfortunately, the unavoidable presence of harmonic distortion in the signal source leads to difficulty in accurately measuring second or higher order derivatives. Furthermore, this prior art derivative determination method requires relatively elaborate instrumentation.

The prior art does know methods for tracking and stabilizing the laser bias at threshold. For instance, D. W. Smith and P. G. Hodgkinson, *Proceedings of the 13th Circuits and Systems International Symposium*, Houston, 1980, pp. 926–930, describe an optical method that relies on synchronous optical detection of small laser test currents and which, for optimum performance, requires mixing of the low-frequency test signal with the high speed data.

An all-electronic method of threshold detection was disclosed by A. Albanese, *Bell System Technical Journal*, Volume 57, No. 5, May-June 1978, pp. 1533–1544. This prior art method relies on modeling the laser electrically as two series components, the first being a constant resistance, and the second having a diode-like characteristic, with a junction voltage saturating at laser threshold. Using an operational amplifier, the resistive component is balanced out. An error voltage signal is then generated by measuring the change in junction voltage in response to the data modulation current. When the junction is saturated, the modulation current should induce no change in junction voltage. With sub-threshold bias, however, a detectable change in junction voltage should be observable. The error signal produced by the modulation current can then be used in a feedback circuit to adjust the bias current to a level close to, but below threshold.

The above prior art method requires the detection of the modulation signal by the feedback circuit, necessitating the use of high frequency electronic circuitry. The method is also sensitive to the frequency of occurrence of logic ONE pulses in the data, requires careful tuning out of the laser series resistance, which must track with temperature, and is hampered especially by the fact that many lasers do not show strong junction voltage saturation at threshold.

As shown by the above discussion, prior art methods for stabilizing the bias current of a laser at or near threshold have considerable drawbacks. Due to the importance of reliably stabilizing the bias current of a laser at or near threshold, over a wide range of operating temperature and other operating conditions, a simple and inexpensively implemented method that is substantially free of the drawbacks associated with prior art methods would be of considerable interest. This application discloses such a method. In particular, the method disclosed herein relies on the electrical characteristics of the laser, but does not require saturation of the laser junction voltage, and is insensitive to both laser series resistance and data pattern.

SUMMARY OF THE INVENTION

In one aspect the invention resides in apparatus comprising an electronic device such as a laser, means for providing electrical bias to the device, and means for controlling or stabilizing the bias. The device has a V/I characteristic that relates a device voltage to a device current, and the amount of bias determines a point on the V/I characteristic, referred to herein as an operating point. The apparatus further comprises means for generating a test signal (e.g., a test current) comprising a nonsinusoidal first component of frequency $f_1$, and for providing the test signal to the device. In preferred embodiments, this first component of the test signal is a square wave component.

The apparatus also comprises means for obtaining a first signal responsive to the test signal provided to the device, means for obtaining from the first signal a second signal that is substantially proportional to a derivative of the V/I characteristic at the operating point determined by the bias, means for obtaining a third signal that is substantially proportional to the amplitude difference between the second signal and a reference signal, and means for changing the bias current in response to the third signal. The second signal can be proportional to the first derivative, the second, third, or still higher order derivative of the V/I characteristic. In an exemplary embodiment, the second signal is proportional to the second derivative during part of the time the apparatus is operated, namely, during a set-up phase, and proportional to the third derivative during another part of the time the apparatus is operated.

Apparatus according to the invention uses novel means for controlling the electronic device, including means for determining derivatives by a novel approach. This approach includes dithering the bias with the nonsinusoidal test signal and synchronously detecting the responsive signal. For instance, if the bias is a bias current, the test signal is advantageously a square wave test current of amplitude $\Delta I$, and the responsive signal is the voltage change $\Delta V$ caused by the current dither. The first derivative of the V/I characteristic at the point corresponding to the bias current at the moment of measurement is proportional to the thus determined $\Delta V$, i.e., $dV/dI \sim \Delta V/\Delta I |_{I=I_{bias}}$.

In order to obtain the second derivative, a second nonsinusoidal (preferably square wave) component is added to the test signal, whereby the derivative of the V/I characteristic can be determined at two points close to the bias point, and $d^2V/dI^2$ determined in a way that is analogous to the fundamental definition of the second derivative. Still higher derivatives can easily be obtained by extension of this procedure, including addition of further nonsinusoidal components to the test signal.

In another aspect the invention resides in a method of controlling the operation of an electronic device having a V/I characteristic that relates a device voltage to a device current. The method comprises providing an electrical bias to the device, with the bias determining an operating point on the V/I characteristic, providing a test signal to the device, with the test signal comprising a nonsinusoidal first component of frequency $f_1$. The method further comprises obtaining a first signal responsive to the test signal provided to the device, obtaining from the first signal a second signal that is substantially proportional to a derivative of the V/I characteristic at the operating point, obtaining a third signal that is substantially proportional to the amplitude difference between the second signal and a reference signal, and setting the bias current in response to the third signal.

The invention can also be embodied in apparatus for measuring a device characteristic, e.g., a higher order derivative of the voltage across an electronic device (for instance, a semiconductor laser or a tunneling diode) as a function of the current through the device, or of the light output of a semiconductor laser as a function of bias current.

In a still further aspect the invention resides in a communication system comprising a semiconductor laser radiation source, an optical fiber transmission medium, means for modulating the output of the laser at a signal frequency, means for coupling the output radiation into the optical fiber, and means for detecting the radiation, after transmission through a length of fiber. The laser has a V/I characteristic that relates the voltage across the laser to the current therethrough. The system also comprises means for providing a bias current to the laser, and means for changing the current through the laser. Furthermore, the system comprises electronic means for regulating the bias current, typically such that the bias current is maintained equal to the current corresponding to a particular point on the V/I characteristic, e.g., at or near the lasing threshold of the device. The current that corresponds to the laser threshold typically changes as a function of temperature and/or time. It is to be emphasized that in the inventive system, the bias current is not necessarily maintained constant, but instead, the system is regulated such that the bias current tracks the threshold current, or other appropriate point on the V/I characteristic.

The means for regulating the bias current comprise first means for providing a test current to the laser, the test current comprising a nonsinusoidal first component of frequency $f_1$ substantially lower than the signal frequency, and also for obtaining a first signal that is substantially proportional to the test current-caused variation of the voltage across the laser. The regulating means further comprise second means for obtaining a second signal that is substantially proportional to a derivative of the V/I characteristic at the point corresponding to the bias current provided to the laser, third means for obtaining a third signal that is substantially proportional to the difference between the second signal and a reference signal, and fourth means for changing the bias current in response to the third signal.

The inventive technique for controlling the operation of a communication system is a particular embodiment of a broader process control technique. In general, a process can be described by specifying one or more variables $X_i$ (i=1, 2, ...) that are functions of one or more parameters $Y_j$ (j=1, 2, ...). Illustratively, a variable can be the rate of electrodeposition of a metal, and the parameters can be bath temperature, concentration of various ions in the bath, etc.

The inventive general technique comprises determining a derivative of a process variable as a function of a process parameter, i.e., determining $d^n X_i/dY_j^n$ (n=1, 2, 3 ...). This is done in a manner akin to the method for determining $d^n V/dI^n$ described herein, by varying the parameter $Y_j$ nonsinusoidally and measuring the resulting variations in $X_i$. Typically sensors that have an electrical output are available for measuring the value of any appropriate parameter and/or variable, and from the sensor outputs an electrical quantity proportional to $d_i X^n/dY_j^n$ is determined, e.g., by a method analogous to the derivative extraction method disclosed herein. This electrical quantity can then be compared with a target value, an error signal formed, and the error signal used to adjust one or more process parameters. Such derivative-based process control can be used independently, or in conjunction with known feedback control methods that do not involve derivative determination, and is advantageously applied in systems that exhibit a strong nonlinearity or even discontinuity in one of their process variables $X_i$. Such nonlinearities typically are enhanced in higher order derivatives $d^n X_i/dY_j^n$ and may be advantageously used for process control.

BRIEF DESCRIPTION OF THE DRAWINGS

FIGS. 7 through 9 schematically depict test signals that can advantageously be used in the determination of the second, third, and fourth derivative of the voltage as a function of the current, respectively, in the inventive method;

Analogous features occurring in different figures are generally identified by the same reference numeral.

DETAILED DESCRIPTION OF THE PREFERRED EMBODIMENT

The inventive method for stabilizing the output of a semiconductor laser is an exemplary embodiment of the invention. It uses a novel real time digital technique for determining voltage derivatives $d^n V/dI^n$ (n=1, 2, 3, ...) that employs synchronous data detection and precisely timed phase reversals of a synchronizing reference clock. The novel technique has a theoretical accuracy that is nearly identical to the theoretically achievable accuracy of the conventional "harmonic distortion" method, and can be easily and inexpensively implemented with readily available, integrated circuitry. It can easily be used in, inter alia, optical communication systems that use semiconductor lasers as radiation sources.

Unlike the prior art harmonic detection scheme, the inventive technique, to be referred to as "Phased Digital Derivative Extraction" (PDDE), uses test currents that need not be sinusoidal, and which preferably are square wave currents. This is a significant departure from the prior art, which results in the possibility of using well established digital technology in the implementation of the method.

I will next demonstrate the principles of PDDE by reference to the determination of the first order voltage derivative, followed by discussion of the determination of second and third order voltage derivatives. From this, the general principle for determining any order derivative by means of the inventive method emerges.

The first voltage derivative versus current is measured by applying a small amplitude (typically square wave) test current $\Delta I_1$ of frequency $f_1$ to the laser, while (typically) slowly sweeping the bias current $I_b$. The voltage change $\Delta V_1$ in response to the test current is measured synchronously. The first voltage derivative (which is the dynamic resistance $R_L$) is essentially equal to $\Delta V_1/\Delta I_1$.

Figure 4:
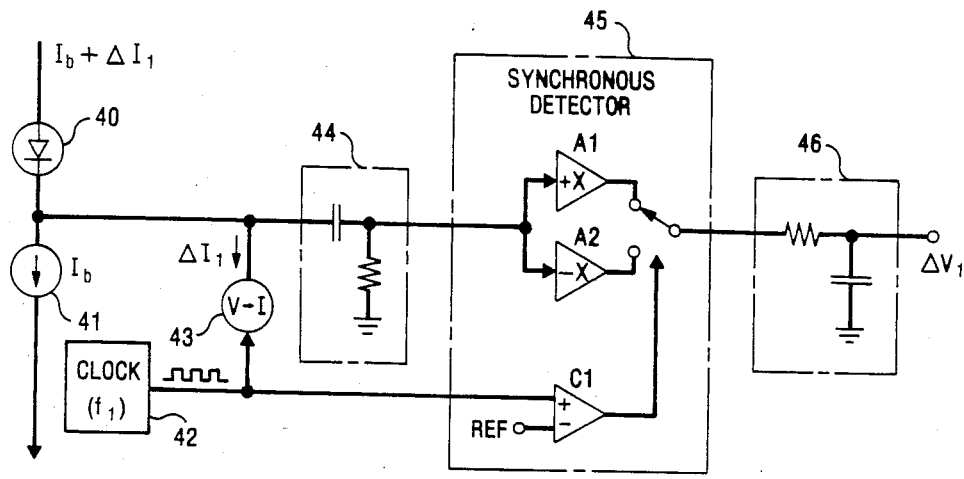
FIGS. 4 through 6 show, schematically and in block diagram form, exemplary means for determining the first, second, and third derivative, respectively, by the inventive method.

An exemplary circuit for determining $\Delta V_1$ in response to the test current is schematically depicted in FIG. 4. Current source 41 causes dc bias current $I_b$ to flow through laser 40. Clock 42 generates a square wave clock signal of frequency $f_1$. The output of 42 is applied to current source 43 which causes test current $\Delta I_1$ of frequency $f_1$ to be superimposed upon the bias current. The dc component of the voltage across 40 is blocked by means of high pass filter 44, and the ac component of the laser voltage is fed to the signal input of synchronous detector 45. The synchronous detector can be thought to comprise a pair of amplifiers A1 and A2, and a comparator C1. Synchronous detectors are well known in the art and are frequently referred to as double balanced mixers. The amplifiers have complementary gain characteristics, i.e., A1 has gain of $+X$ and A2 has gain $-X$. The clock output is also connected to the non-inverting input of C1, with a reference voltage supplied to the reference input, such that the output of the comparator switches at frequency $f_1$, causing the output of the synchronous detector to be switched between A1 and A2 at the same frequency, depending on the polarity of the comparator output. The output of the synchronous detector is fed to low pass filter 46 to take the dc average of the output. The dc average is proportional to $\Delta V_1$, and thus proportional to $R_L$. When scaled by the proportionality factor $\Delta I_1$ and the gain factor $X/2$, it is the voltage derivative of the laser.

In a circuit as depicted in FIG. 4, only signal components varying at the same frequency as the test current add in phase at the output. All other components are mixed to some nonzero frequency and then eliminated by the low-pass filter.

From the definition of the derivative, $dR_L/dI \sim \Delta R_L/\Delta I = (R_{L(A)} - R_{L(B)})/\Delta I_2$, where subscripts A and B identify two points on the I/V characteristic of the device that differ by $\Delta I_2$, and $R_{L(A,B)} = \Delta V_{1(A,B)}/\Delta I_1$, thus:

$$d^2V/dI^2 \sim (\Delta V_{1(A)} - \Delta V_{1(B)})/\Delta I_1 \Delta I_2.$$

The second voltage derivative can thus be determined by applying a two-component test current to the device. One of the components, of amplitude $\Delta I_1$, has frequency $f_1$ and is employed as previously described. The other component has amplitude $\Delta I_2$ and frequency $f_2$ and is employed to establish two measurement points A and B, separated by $\Delta I_2$. As before, these components typically are nonsinusoidal, advantageously being square waves. For instance, the former might be a 1 kHz dither of amplitude 500 $\mu$A, while the latter could be a 125 Hz dither of amplitude 1 mA.

Figure 7:
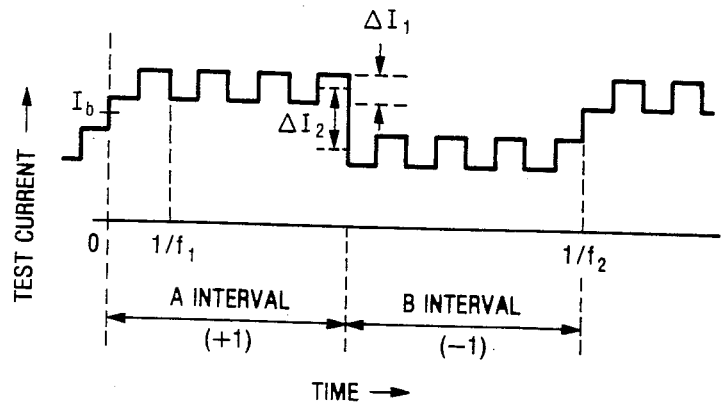

FIG. 7 shows an exemplary test current for use in determination of the second voltage derivative according to the invention. Superimposed on the bias current $I_b$ is a slow square wave of frequency $f_2$ and peak-to-peak amplitude $\Delta I_2$, as well as a fast square wave of frequency $f_1$ and peak-to-peak amplitude $\Delta I_1$. The "+1" and "−1" shown on the time axes of FIGS. 7, 8 and 9 indicate the cosine of the phase difference between the test current and the comparator input signal of the synchronous detector.

Figure 5:
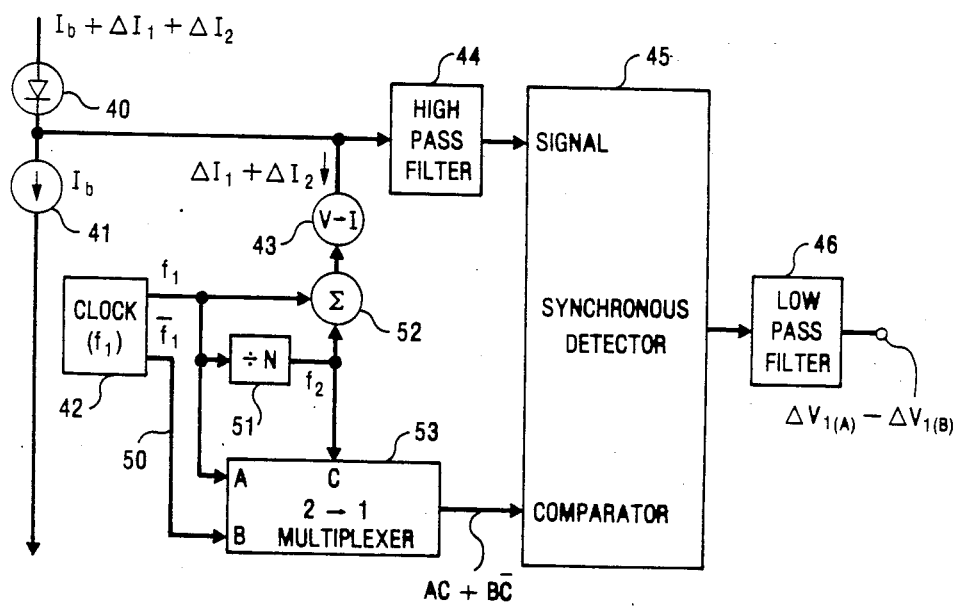

An exemplary circuit for determining the second voltage derivative of a laser V/I characteristic is shown schematically in FIG. 5. The close similarity of this circuit to the previously described circuit for determining the first derivative is apparent. The normal output of clock 42 is fed to $\div N$ digital counter 51, voltage scaling/summing junction 52, and the A-input of 2→1 multiplexer 53. The purpose of 51 is to generate the $\Delta I_2$ signal at frequency $f_2$. Clock 42 also has inverted output 50 which is fed to the B-input of 53. The multiplexer steers either the normal or the inverted clock signal to the comparator input of synchronous detector 45. The selection of the normal or inverted clock signal is controlled by the signal at frequency $f_2$, shifting the phase of the comparator input by 180° at intervals of $\frac{1}{2}f_2$. This has the effect of multiplying the detector input by both an $f_2$ and an $f_1$ component, resulting in multiplication of any voltage component at frequency $f_1$ by +1 during the interval $0 \leq t \leq \frac{1}{2}f_2$, and by −1 during the interval $\frac{1}{2}f_2 \leq t \leq 1/f_2$. The detector output, after low-pass filtering, is proportional to $\Delta V_{1(A)} - \Delta V_{1(B)}$, and the output, after normalization by the product $\Delta I_1 \Delta I_2$, is proportional to the second voltage derivative.

The third voltage derivative can be computed in similar fashion. Selecting four points A, B, C and D on the I/V curve where resistance is to be measured, with, for simplicity, points B and C chosen to coincide, it is easy to show that $$d^3V/dI^3 \sim (\Delta V_{1(A)} - 2\Delta V_{1(B)} + \Delta V_{1(D)})/\Delta I_1 \Delta I_2^2.$$

Figure 8:
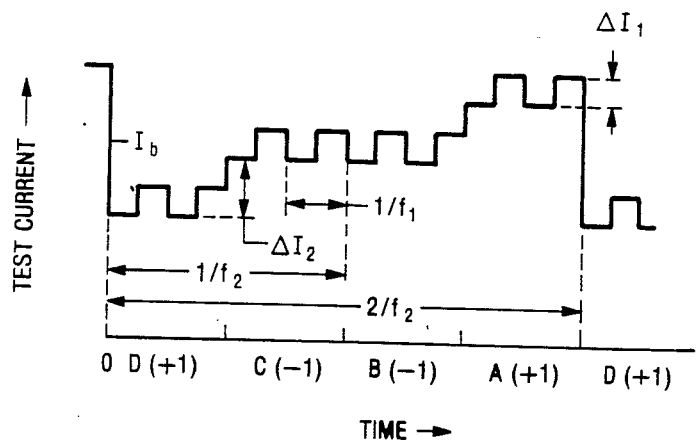

An exemplary test current useful for determining the third derivative is illustrated in FIG. 8. The waveform consists of four components: a dc bias $I_b$, and three square wave components. One of the ac components has frequency $f_2/2$, another has frequency $f_2$, and the third has a frequency $f_1$, with $f_1 > f_2$. As illustrated, the former two components both have peak-to-peak amplitude $\Delta I_2$, and the latter $\Delta I_1$. Also, as illustrated, $f_1 = 4f_2$. It will be appreciated that these relationships are exemplary only. Indicated on FIG. 8 are also the above referred to four time intervals.

Figure 6:
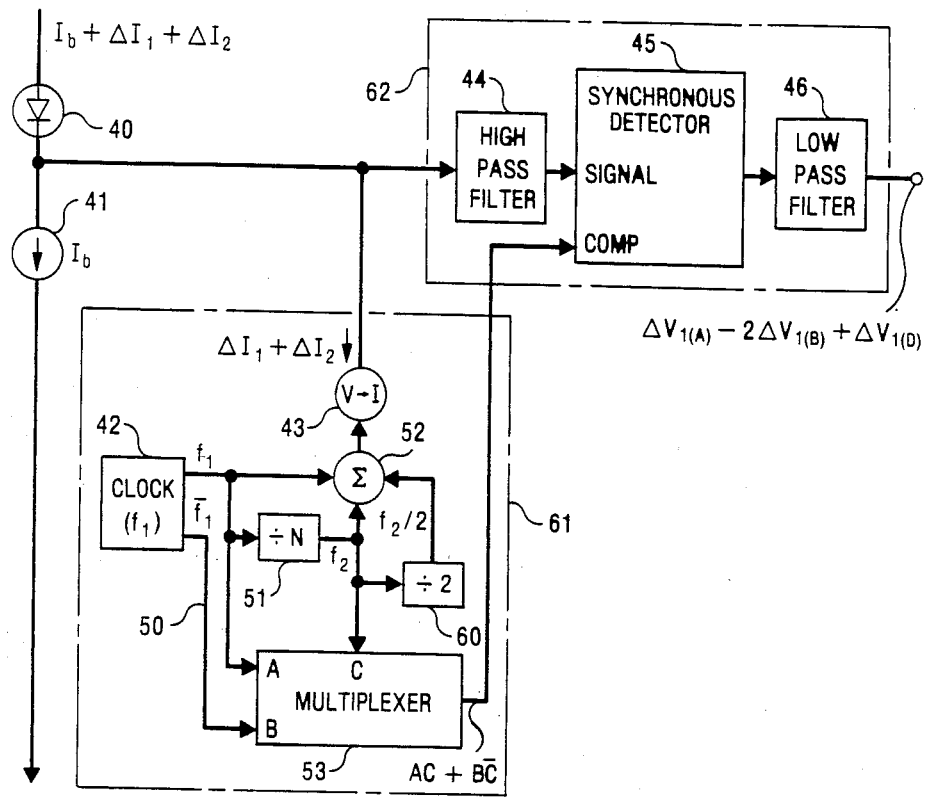

FIG. 6 schematically illustrates an exemplary circuit capable of determining the third voltage derivative of the V/I characteristic of a device 40. The similarity of this circuit to the one illustrated in FIG. 5 is evident. The sole difference is a digital $\div 2$ counter following 51.

The output of 60 changes once during a complete cycle in $f_2$. When the output of 60 is summed with the signals varying at $f_2$ and $f_1$, the staircase function of FIG. 8 is generated. The signal detection is synchronous as before, and the subtraction operation required for determining the third derivative will be accomplished by clocking the synchronous detector 180° out of phase during the B and C intervals relative to the A and D intervals.

From the preceding discussion, it is apparent that derivatives of arbitrary order can be produced by the inventive method. For example, a fourth order voltage derivative can be generated using the exemplary test current illustrated in FIG. 9, with the appropriate phasing of the detecting mixer. The current illustrated in FIG. 9 consists of four square waves superimposed on the dc bias current. The exemplary ac components have frequencies $3f_2$, $2f_2$, $f_2$, and $f_1$.

Using the inventive technique, it is also possible to measure several derivatives simultaneously, by using the same test current and dedicated mixers. For example, using the test current illustrated in FIG. 8 with test intervals, respectively, A, B, D and C, dV/dI is measured by applying +1+1+1+1 phasing to the mixer, $d^2V/dI^2$ by applying −1−1+1+1 phasing, and $d^3V/dI^3$ by applying +1−1−1+1 phasing. This scheme also can be extended to derivatives of order higher than the third, as will be apparent to those skilled in the art.

Mathematical analysis of the PDDE method shows that the method in principle can be highly accurate, with the magnitude of the error increasing as the order of the derivative increases, and as the ratio of $\Delta I_1$ and/or $\Delta I_2$ to $I_b$ increases. For instance, for an exponential I/V curve, when $\Delta I_1$ is equal to 0.5 mA and $\Delta I_2$ is equal to 1 mA, the error can be less than 1% for $I_b$ greater than 2 mA for the first derivative, 6 mA for the second derivative, and 11 mA for the third derivative.

Although the PDDE method can be used to form the voltage derivative of any I/V device characteristic, and can, in principle, be used to determine the derivatives of one system parameter with respect to another system parameter, a particularly advantageous application of the method is in the stabilization of a semiconductor laser at or near the threshold of the laser. I will next describe an exemplary implementation of such a stabilization scheme.

Figure 1:
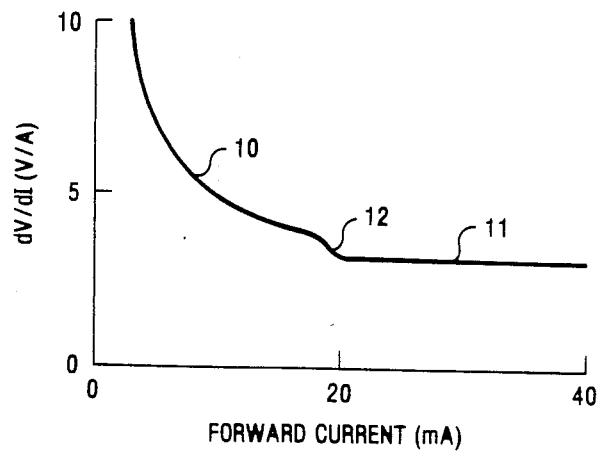
FIGS. 1 through 3 show experimentally determined curves of first, second, and third derivatives, respectively, of the voltage across a semiconductor injection laser with respect to the forward current through the device, as a function of the forward current.
Figure 2:
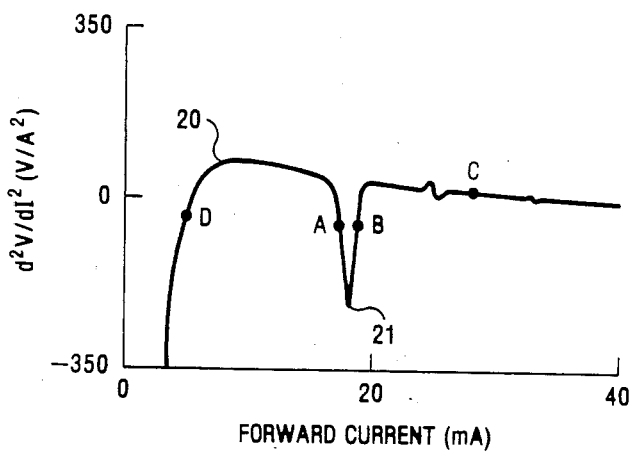
Figure 3:
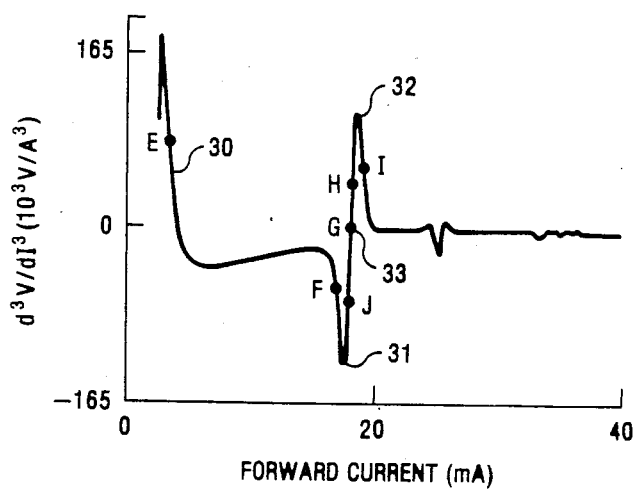

FIG. 2 shows $d^2V/dI^2$ of a laser V/I characteristic, as a function of $I_b$, with 21 corresponding to threshold. Points A and B on curve 20 identify bias currents near but slightly below and above threshold, respectively. A simple feedback scheme typically cannot determine the bias location relative to threshold (i.e., above or below), and therefore will not function properly for arbitrary initial bias. It is typically more advantageous to use a third derivative stabilization scheme, as can be seen from FIG. 3, which shows $d^3V/dI^3$ as a function of $I_b$. Any of bias points F, G, or I may be employed, with stable operation guaranteed for $I_b < I_{th}$ for point F; for $I_b \sim I_{th}$ for point G; and for $I_b > I_{th}$ for bias point I.

Figure 10:
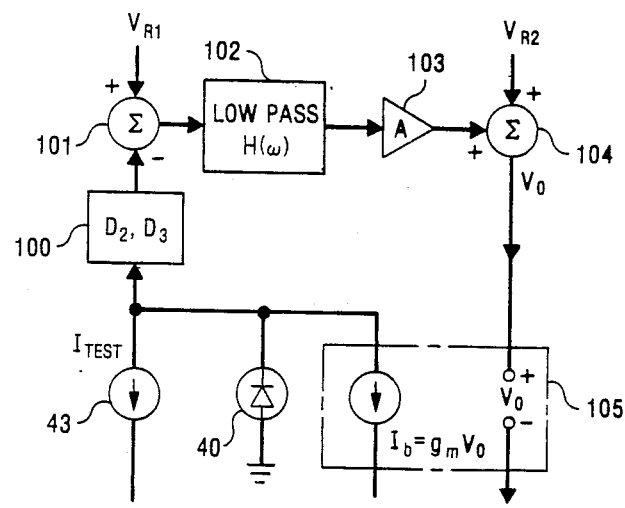
FIG. 10 shows, also schematically and in block diagram form, exemplary means according to the invention for controlling the bias current through a device.

The functional diagram of an exemplary feedback loop is shown in FIG. 10. Block 100 produces a voltage proportional to either the second or third order derivative, measured in response to a test current produced by current generator 43. The output voltage of 100 is inverted and summed with a reference voltage $V_{R1}$ in 101, the resulting composite signal low-pass filtered in 102 to produce a dc derivative signal which is amplified in amplifier 103, summed with a second reference voltage $V_{R2}$ in adder 104, and the voltage sum fed into a transconductance stage 105 to directly control the laser bias current $I_b$.

In a particularly advantageous stabilization scheme, the second derivative is used to locate threshold. This can be achieved as follows: when power is applied to the laser, the current is pre-biased to a point known to be above threshold, e.g., point C in FIG. 2. Using feedback with an error signal produced by the second derivative, the bias current is forced to converge to point B in FIG. 2, just above threshold. At this time, second derivative stabilization is complete, and laser bias could be maintained at this point. However, it may be desirable to go to third derivative stabilization and force the bias current to point G, precisely at threshold, in FIG. 3. In that case, one can switch to a third derivative-based error measurement, and apply a negative "kickback" current to push the laser bias into a region of third derivative stability near point G in FIG. 3. This kickback current will initially force the bias from somewhere near point I in FIG. 3 to somewhere between points J and H. Feedback will then cause bias to converge to point G. It is this advantageous combined second/third derivative stabilization scheme that I will next describe.

With component 100 set to produce a voltage proportional to the second derivative, and power applied to the circuit of FIG. 10 at time $t=0$, $I_b = g_m V_{R2}$ at $t=0+$, where g is the transconductance of 105. Thus, $V_{R2}$ is advantageously adjusted to bias the laser well above threshold at power-on, e.g., at point C of FIG. 2. For t much greater than the time constant of the feedback loop, $$I_b \sim I_{th} + V_{R1}/(\Delta I_1 \Delta I_2 C_2) - K_2/C_2$$

where $K_2$ is the maximum negative excursion of the 2nd derivative peak at threshold, and $C_2$ is the positive slope of the derivative just above threshold, and all other quantities have their previously defined meaning. $V_{R1}$ is advantageously chosen to bias the laser slightly above threshold, e.g., at point B in FIG. 2.

If, at time $t'=0$, after attainment of a stable second derivative stabilization point, the operation of component 100 is switched to provide an output proportional to the third derivative, then at time $t'=0+$, $$I_b = g_m V_{R2} + I_L|_{t'=0}.$$

This shows that $I_b$ at changeover depends on the second derivative bias point, so $V_{R2}$ must be adjusted to substantially instantaneously move bias into the proper zone of third derivative convergence. This typically requires about 1 mA negative current shift. When $t' \to \infty$ then generally $$I_b \sim I_{th} + V_{R1}/(\Delta I_1 \Delta I_2{}^2 C_3),$$

where $C_3$ is a constant proportional to the slope of the third derivative curve at threshold. For stabilization at threshold, $V_{R1}$ thus should be set equal to zero.

An exemplary laser stabilization circuit was implemented, using only standard, commercially available, components. The ICs used are listed in Table I.

TABLE I

| INTEGRATED CIRCUIT CATALOG | |
|---|---|
| Component | Description |
| IC1 | LM555 Timer |
| IC2 | 4013 CMOS Dual D Flipflop |
| IC3 | 4024 CMOS Counter |
| IC4,IC4' | 14538 CMOS Monostable Multivibrator |
| IC5 | 4016 CMOS Quad Analog Switch |
| IC6 | AD630 Synchronous Modulator/Demodulator |
| IC7 | AD630 Synchronous Modulator/Demodulator |
| IC8 | LF347 Quad Op-Amp |
| IC9 | LF353 Dual Op-Amp |
| IC10 | LF351 Op-Amp |
| IC11 | LF351 Op-Amp |
| IC12 | LF353 Dual Op-Amp |
| IC13 | 502BW Western Electric Building Block |

Figure 11:
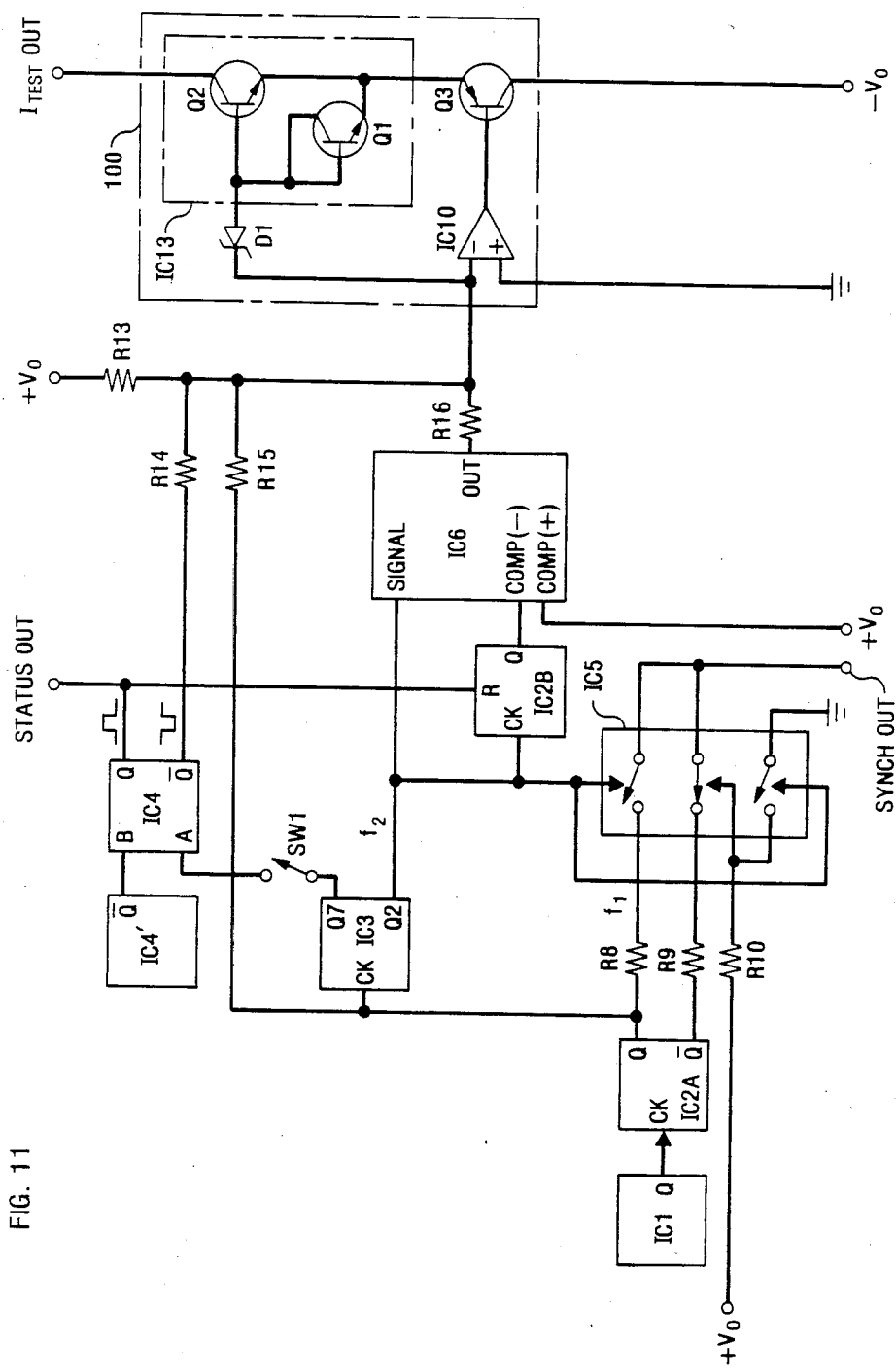
FIGS. 11 and 12 together depict an exemplary circuit for stabilizing the bias current of a semiconductor laser.

The portion of the circuit of FIG. 6 that is enclosed by dashed line 61 is shown in greater detail in FIG. 11. Circuit details that are well known to, or easily derived by, those skilled in the art are generally not shown. Such detail includes, for instance, pin numbers of ICs, supply voltages, some blocking or by-pass capacitors, some current limiting or voltage dividing resistors, and the like.

The circuit of FIG. 11 can operate in two modes: second derivative and third derivative. The operating mode is determined by monostable IC4 and IC4' and is indicated by "STATUS OUT". When power is applied, IC4 generates a 30 second power-on pulse. During this time, STATUS is high, indicating second derivative operation. At the conclusion of this pulse, STATUS goes low, indicating third derivative operation. The circuit may be forced into second derivative operation by closing switch SW1. System timer IC1 operates at about 50 kHz. Flip-flop IC2A divides this clock down to 25 kHz with a 50% duty cycle. This is the critical timing component in the circuit, producing the clock signals $f_1$ and $\bar{f}_1$ that yield $\Delta I_1$ and synchronize the detector. The $\div 4$ output of counter IC3 produces the secondary clock $f_2 = f_1/4$, approximately equal to 6.25 kHz.

IC6 is a balanced modulator clocked by IC2B, with the frequency $f_2$ fed to its signal input. When the circuit is in a second derivative mode, flip-flop IC2B is held at 0, and the output of IC6 is the same as its input, i.e., a train of 0 V, +15 V, 0 V, +15 V, . . . pulses at frequency $f_z/4$. When the circuit is in the third derivative mode, flip-flop IC2B is clocked by IC3 as a $\div 2$ counter (block 60 in FIG. 6). This causes the output of IC6 to invert every other pulse from IC3. In this case, the output of IC6 is the following repeating pattern: 0 V, +15 V, 0 V, −15 V, 0 V, +15 V, . . . .

The part of the circuit enclosed by broken line 100 in FIG. 11 corresponds substantially to components 52 and 43 of FIG. 6. The negative input of operational amplifier IC10 is incrementally grounded by feedback around IC10. Test current $\Delta I_1$ of peak-to-peak amplitude about 0.5 mA is produced by IC2A. Step current $\Delta I_2$ is produced by IC6, its amplitude being about 1 mA. $R_{13}$ provides an offset to keep the total injected test current always positive. Finally, $R_{14}$ and the status signal balance the test current so that its average value is approximately 1 mA, independent of the operating mode.

IC5 is a digital 2→1 multiplexer corresponding to 53 in FIG. 6, functionally equivalent to analog switches connected to form a single pole/double throw switch. The resulting "SYNCH" output is fed to the synchronous detector. Those skilled in the art will appreciate that an EXCLUSIVE OR gate could be substituted for IC5.

Figure 12:
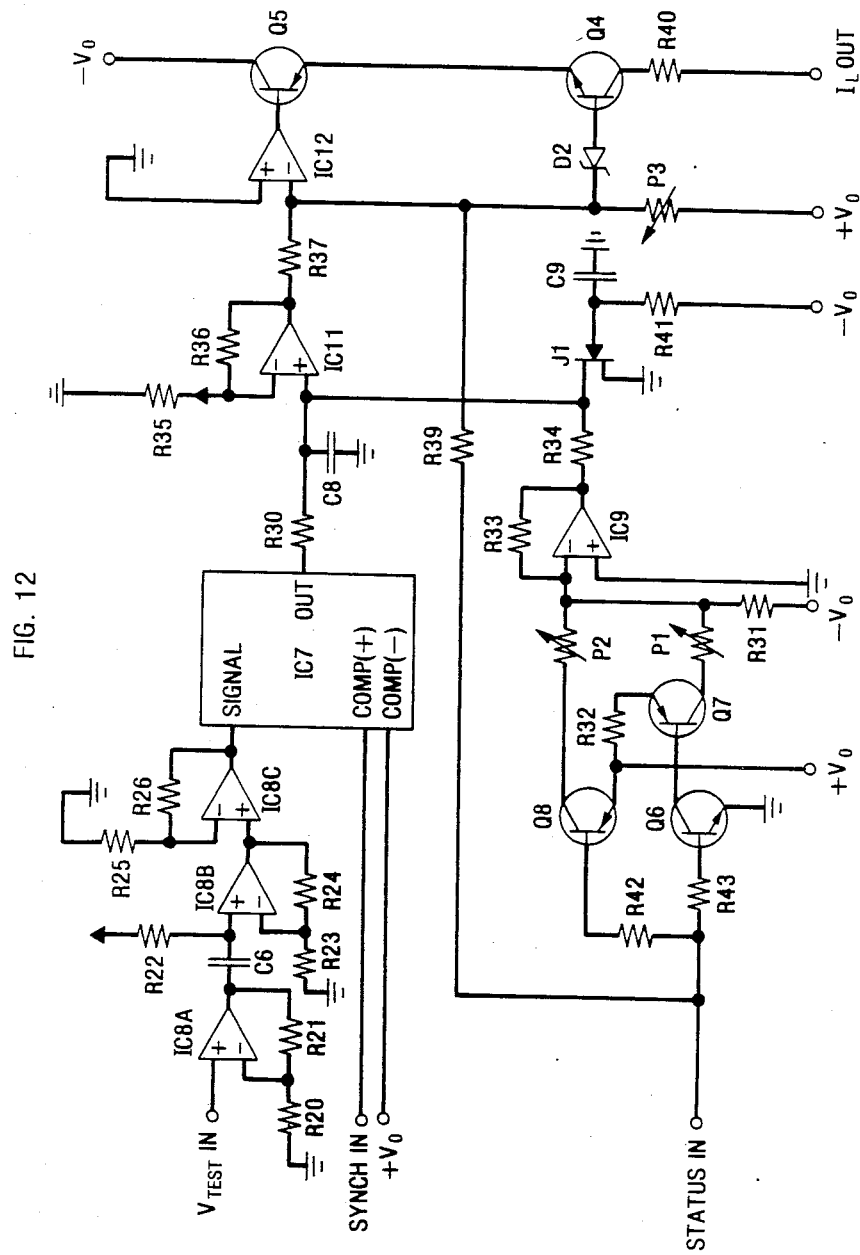

FIG. 12 shows in greater detail the circuit corresponding substantially to the components enclosed by broken line 62 in FIG. 6, in addition to component 41 of that Figure. As will be appreciated by those skilled in the art, not all passive components required for satisfactory operation of the circuit are shown. The practitioner can easily provide such design detail.

The core of this circuit section is the synchronous detector IC7, a precision component that provides the entire detector function on a single chip. $V_{test}$ is the voltage change across the laser in response to $I_{test}$ (see FIG. 11), and is advantageously measured as close as possible to the laser cathode. This voltage is amplified $\times 5$ by IC8A, high pass filtered and then amplified successively $\times 20$ and $\times 3$ by IC8B and IC8C, respectively. The output of IC8C is again high-passed (filter not shown) and then delivered to the signal input of IC7. IC7 is clocked by the SYNCH signal from IC5, with only the portion of $V_{test}$ at $f_1$ being in-phase with the synchronization signal. Other frequency components are shifted with random phase to the output and are filtered out by a low-pass filter consisting of C8 and R30.

IC9 adds offset $V_{R1}$ to the output of IC7, and is adjustable by means of $P_1$ or $P_2$. Transistors $Q_6$, $Q_7$ and $Q_8$ form a circuit that allows both positive and negative offset adjustment. When the circuit is in second derivative mode, STATUS is high, and only $P_1$ controls the offset, and when the circuit is in third derivative mode, STATUS is low and only $P_2$ controls the offset. These offset controls typically must be adjusted properly for any given family of lasers or laser packages. JFET $J_1$ grounds $C_8$ when power is off.

The voltage on $C_8$ is directly proportional to $-d^2V/dI^2$ or $-d^3V/dI^3$, depending on the circuit status. IC11 (which corresponds to amplifier 103 in FIG. 10) amplifies this voltage by $\times 100$. The output of IC11 is summed with two other signals at the input of IC12. The first of these signals is proportional $V_{R2}$, a dc voltage set by $P_3$ that determines the initial bias current in the laser when power is turned on. $R_{39}$ provides a "kickback" current of approximately 1 mA when the circuit switches from second to third derivative mode. This ensures that the laser bias is forced into the region of third derivative stability at the instant of second to third derivative changeover. Finally, IC12 supplies the actual bias current to the cathode of the laser. An alternative voltage-to-current converter that supplies current to the anode of the laser is also possible, as will be appreciated by those skilled in the art.

Figure 13:
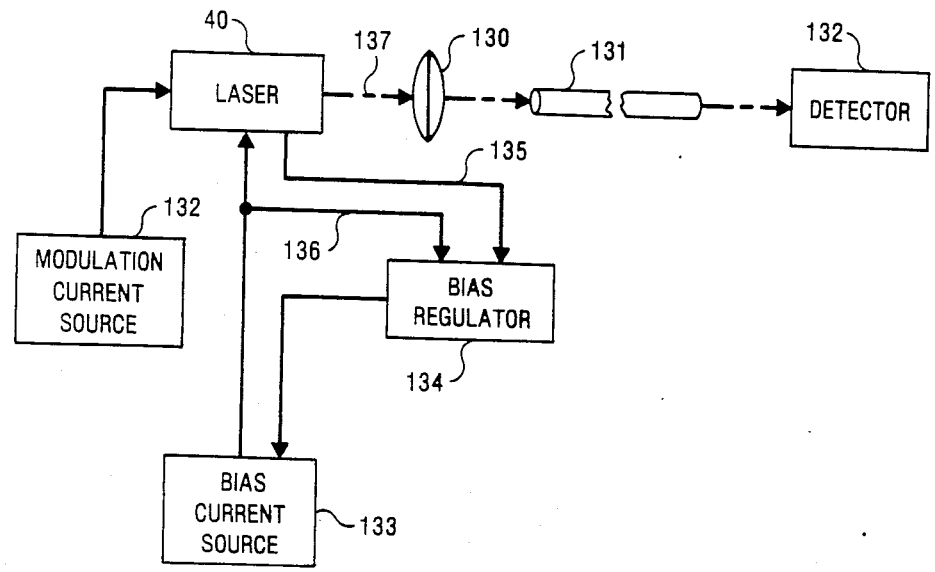
FIG. 13 schematically depicts a communication system according to the invention.

The above described device stabilization technique has broad applicability, with laser stabilization being an exemplary application. A preferred application of a laser stabilized according to the invention is in a lightguide communication system. Such systems are well known and do not require detailed description. FIG. 13 schematically depicts such a system, in which laser 40 emits radiation 137 that is coupled by coupling means 130 into optical fiber 131 and is detected, after transmission through the fiber, by detector 132. A bias current is provided to the laser by means of bias supply 133, and a high frequency modulation current by means of modulation current source 132. Bias regulator 134 receives signals indicative of the laser voltage and of the dc bias by means of connections 135 and 136, respectively, and feeds a control signal to 133, whereby the dc bias level is controlled.

Figure 14:
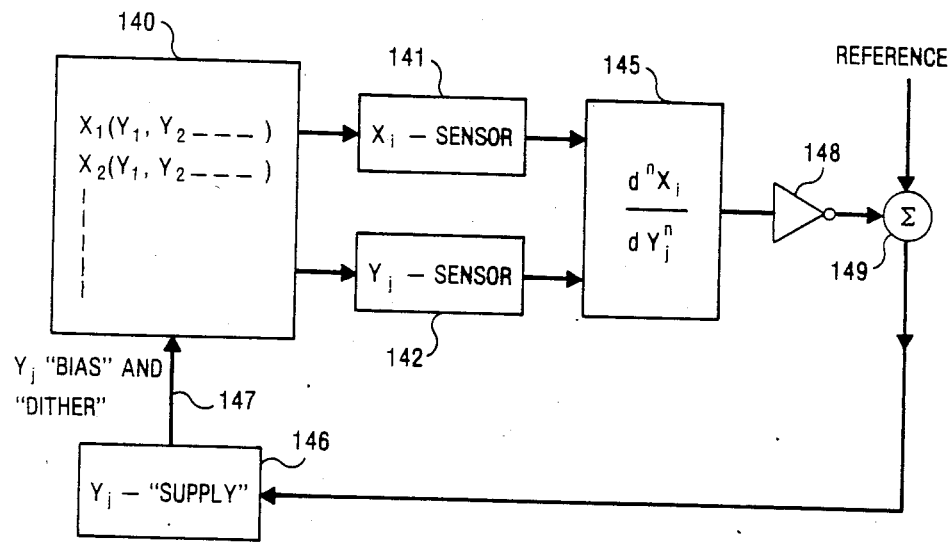
FIG. 14 schematically depicts a generalized process with a control system according to the invention.

As previously indicated, the instant technique for controlling the operation of a communication system is a particular example of a broadly applicable process control technique. FIG. 14 schematically illustrates this process control technique. Block 140 represents a general process, e.g., a chemical, electrochemical, pharmaceutical, or other technological process, which is characterized by variables $X_1$, $X_2$, ..., the variables being functions of parameters $Y_1$, $Y_2$, .... The value of a variable $X_i$ is sensed by means of sensor 141, and the value of a parameter $Y_j$ is sensed by sensor 142. The sensor outputs are supplied to block 145, which represents means for determining a derivative $d^nX_i/dY^n_j (n=1, 2, ...)$ from signals proportional to $X_i$ and $Y_j$. The output of 145 is (typically) inverted by means of inverter 148 and summed with a reference signal in adder 149, and the resulting error signal 150 fed to "$Y_j$-supply" 146, i.e., to means for providing an input to 140 that results in a particular value of parameter $Y_j$. For instance, 146 could be means for changing the pressure in a reactor vessel. The output of 146 contains both a constant or slowly-varying value (the "bias") and one or more nonsinusoidally varying components (the "dither"). The latter produce corresponding changes in $X_i$, which are sensed by 141, and the dither-component of $Y_j$ is sensed by 142. An examplary application of the control process according to the invention is in vehicular control, e.g., in anti-lock braking systems for automobiles, trucks, trains, and the like. Other applications will be apparent to those skilled in the art.

It is frequently desirable to measure a derivative, especially a higher order derivative, of a device characteristic, and PDDE can also be advantageously used for this purpose. The elements of the technique as recited, for instance, in the above description of the inventive apparatus, except the means for obtaining an error signal and the means for changing the bias in response to the error signal, are also present in measuring apparatus according to the invention. In addition, the measuring apparatus comprises means for displaying the value of the derivative, or other means for indicating the measurement result. Such means may comprise a visual read-out, electrical read-out means that provide a digital or analog signal, or go/no go indicators such as signal lights. Such means are conventional and well known in the art.

What is claimed is:

1. A communication system comprising a semiconductor laser source of electromagnetic radiation having a V/I characteristic that relates a laser voltage to a laser current that comprises a bias current;

means for modulating the radiation at a signal frequency;

an optical fiber transmission channel;

means for coupling the modulated electromagnetic radiation into the optical fiber at a first fiber location; and means for detecting the modulated electromagnetic radiation, after its transmission through the optical fiber from the first to a second fiber location;

CHARACTERIZED IN THAT the system further comprises regulating means adapted for maintaining the bias current substantially equal to the current corresponding to a predetermined point on the V/I characteristic, the regulating means comprising (a) first means that comprise
  (i) test current generating means that are conductively connected to the laser source such that the laser current comprises a test current comprising at least a first nonsinusoidal component having a frequency $f_1$ that is substantially lower than the signal frequency, with the laser voltage comprising a test current-caused component; and
  (ii) means, responsive to the laser voltage, for producing a first signal that is substantially proportional to the test current-caused component of the laser voltage;
(b) second means, responsive to the first signal, for producing a second signal that is substantially proportional to a derivative of the V/I characteristic at the predetermined point on the V/I characteristic;
(c) third means, responsive to the second signal, for obtaining an error signal, with the amplitude of the error signal being a function of the amplitude of the second signal; and
(d) fourth means for changing the bias current in response to the error signal.

2. System of claim 1, wherein the point on the V/I characteristic is a point at which at least one derivative $d^n V/dI^n$ is nonzero, with $\underline{n}$ being an integer greater than 1.

3. System of claim 2, wherein the point is at, or close to, the lasing threshold.

4. System of claim 2, wherein the second signal is proportional to the third derivative ($d^3V/dI^3$) during at least a part of the time the bias current is being regulated.

5. System of claim 2, wherein the second signal is proportional to the second derivative ($d^2V/dI^2$) during at least a part of the time the bias current is being regulated.

6. System of claim 4, wherein the second signal is proportional to the second derivative ($d^2V/dI^2$) during a further part of the time the bias current is being regulated.

7. System of claim 1, wherein the first component of the test current is substantially a square wave.

8. System of claim 1, wherein the test current further comprises a second nonsinusoidal component and a third nonsinusoidal component, the second and third components having frequencies $f_2$ and $f_3$, respectively, with $f_1 > f_2 > f_3$.

9. System of claim 8, wherein $f_1 = mf_2$, and $f_1 = nf_3$, with $\underline{m}$ and $\underline{n}$ being positive integers, and the first, second and third components are substantially square waves.

10. System of claim 1, wherein the second means comprise synchronous detection means.

11. Apparatus comprising an electronic device having a V/I characteristic that relates a device voltage to a device current, the apparatus comprising means for providing an electrical bias to the device, the bias determining an operating point on the V/I characteristic, the apparatus further comprising
  (a) first means comprising test signal generating means conductively connected to the device such that the test signal is applied to the device, the test signal comprising a first nonsinusoidal component of frequency $f_1$, and the first means further comprising means for generating a first signal in response to the applied test signal;
  (b) second means, responsive to the first signal, for generating a second signal that is substantially proportional to a derivative of the V/I characteristic at the operating point determined by the electrical bias;
  (c) third means, responsive to the second signal, for generating an error signal, with the amplitude of the error signal being a function of the amplitude of the second signal; and
  (d) fourth means for changing the electrical bias in response to the error signal.

12. Apparatus of claim 11, wherein the electronic device is a semiconductor laser, and the V/I characteristic relates the voltage across the laser to the current through the laser.

13. Apparatus of claim 11, wherein the first nonsinusoidal component of the test signal is substantially a square wave.

14. Apparatus of claim 12, wherein the test signal is a test current, and the first signal is a voltage across the laser comprising an ac voltage of frequency $f_1$.

15. Apparatus of claim 11, wherein the second means comprise synchronous detection means.

16. Apparatus of claim 12, wherein the second signal is proportional to the third derivative ($d^3V/dI^3$).

17. Apparatus of claim 12, wherein the second signal is proportional to the second derivative ($d^2V/dI^2$).

18. Apparatus of claim 11, wherein the test signal further comprises a second nonsinusoidal component, the second component having frequency $f_2$, with $f_1 > f_2$.

19. Apparatus of claim 18, wherein the test signal further comprises a third nonsinusoidal component, the third component having frequency $f_3$, with $f_2 > f_3$.

20. Apparatus of claim 11, wherein the amplitude of the error signal is a function of the amplitude difference between a reference signal and a signal related to the second signal.

21. Method of controlling the operation of an electronic device having a V/I characteristic relating a device voltage to a device current, the method comprising providing an electrical bias to the device, the bias determining an operating point on the V/I characteristic, CHARACTERIZED IN THAT the method further comprises
  (a) providing a test signal to the device, the test signal comprising a first nonsinusoidal component of frequency $f_1$;
  (b) obtaining a first signal responsive to the test signal provided to the device;
  (c) obtaining from the first signal a second signal that is substantially proportional to a derivative of the V/I characteristic at the operating point determined by the bias;
  (d) obtaining an error signal that is related to the amplitude difference between the second signal and a reference signal; and
  (e) setting the bias in response to the error signal.

22. Method of claim 21, wherein the first component is substantially a square wave.

23. Method of claim 21, wherein the second signal is proportional to the second derivative ($d^2V/dI^2$) during at least a part of the time the operation of the device is controlled.

24. Method of claim 23, wherein the second signal is proportional to the third derivative ($d^3V/dI^3$) during a part of the time the operation of the device is controlled.

25. Method of claim 21, wherein the device is operated at a signal frequency that is substantially higher than $f_1$.

26. Method of claim 25, wherein the device is a semiconductor laser, the bias is a bias current, and the bias current is modulated at the signal frequency.

27. Apparatus for measuring a derivative of a characteristic curve of an electronic device, the apparatus comprising
(a) means for providing an electrical bias to the device, the bias determining an operating point on the characteristic curve;
(b) means for generating a test signal, for applying the test signal to the device, and for generating a first signal responsive to the test signal applied to the device, the test signal comprising a first nonsinusoidal component of frequency $f_1$;
(c) means, responsive to the first signal, for generating a second signal that is substantially proportional to a derivative of the characteristic curve at the operating point determined by the bias; and
(d) means responsive to the second signal for reading out the result of a derivative measurement.

28. Apparatus of claim 27, wherein the device is either a tunnel diode or a semiconductor laser and the characteristic curve is the V/I characteristic of the device, where V is the voltage across the device and I is the bias current through the device, or the characteristic curve is the L/I characteristic of the laser, where L is the light output of the laser.

29. Apparatus of claim 27, wherein the first nonsinusoidal component of the test signal is substantially a square wave.

30. Apparatus of claim 27, wherein the test signal further comprises at least a second nonsinusoidal component, the second component having frequency $f_2 < f_1$.

* * * * *